United States Patent
Jongbloed et al.

(10) Patent No.: US 9,431,238 B2
(45) Date of Patent: Aug. 30, 2016

(54) REACTIVE CURING PROCESS FOR SEMICONDUCTOR SUBSTRATES

(71) Applicant: ASM IP Holding B.V., Almere (NL)

(72) Inventors: Bert Jongbloed, Oud-Heverlee (BE); Dieter Pierreux, Dilbeek (BE); Cornelius A. van der Jeugd, Heverlee (BE); Herbert Terhorst, Amersfoort (NL); Lucian Jdira, Nieuw Vennep (NL); Radko G. Bankras, Almere (NL); Theodorus G. M. Oosterlaken, Oudewater (NL)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/718,517

(22) Filed: May 21, 2015

(65) Prior Publication Data
US 2015/0357184 A1  Dec. 10, 2015

Related U.S. Application Data

(60) Provisional application No. 62/008,404, filed on Jun. 5, 2014.

(51) Int. Cl.
*H01L 21/02* (2006.01)

(52) U.S. Cl.
CPC ... *H01L 21/02233* (2013.01); *H01L 21/02337* (2013.01)

(58) Field of Classification Search
None
See application file for complete search history.

(56) References Cited

U.S. PATENT DOCUMENTS

| | | |
|---|---|---|
| 5,874,367 A | 2/1999 | Dobson |
| 6,189,368 B1 | 2/2001 | Ichida et al. |
| 6,492,283 B2 | 12/2002 | Raaijmakers et al. |
| 6,562,735 B1 | 5/2003 | Allman et al. |
| 7,501,292 B2 | 3/2009 | Matsushita et al. |
| 7,622,369 B1 | 11/2009 | Lee et al. |
| 7,651,959 B2 | 1/2010 | Fukazawa et al. |
| 7,718,553 B2 | 5/2010 | Fukazawa et al. |

(Continued)

FOREIGN PATENT DOCUMENTS

| | | |
|---|---|---|
| JP | 2001-230246 | 8/2001 |
| JP | 3392789 | 3/2003 |

(Continued)

OTHER PUBLICATIONS

Kaufman-Osborn et al. "In-situ non-disruptive cleaning of Ge(100) using $H_2O_2(g)$ and atomic hydrogen", Surface Science 630: 254-259, Aug. 2014.

(Continued)

*Primary Examiner* — Asok K Sarkar
(74) *Attorney, Agent, or Firm* — Knobbe, Martens, Olson & Bear LLP

(57) ABSTRACT

In some embodiments, a reactive curing process may be performed by exposing a semiconductor substrate in a process chamber to an ambient containing hydrogen peroxide, with the pressure in the process chamber at about 300 Torr or less. In some embodiments, the residence time of hydrogen peroxide molecules in the process chamber is about five minutes or less. The curing process temperature may be set at about 500° C. or less. The curing process may be applied to cure flowable dielectric materials and may provide highly uniform curing results, such as across a batch of semiconductor substrates cured in a batch process chamber.

31 Claims, 8 Drawing Sheets

(56) References Cited

U.S. PATENT DOCUMENTS

| | | |
|---|---|---|
| 7,781,352 B2 | 8/2010 | Fukazawa et al. |
| 8,007,865 B2 | 8/2011 | Delabie et al. |
| 8,445,078 B2 | 5/2013 | Liang et al. |
| 2001/0031562 A1 | 10/2001 | Raaijmakers et al. |
| 2002/0196591 A1 | 12/2002 | Hujanen et al. |
| 2003/0161951 A1 | 8/2003 | Yuan et al. |
| 2006/0165904 A1 | 7/2006 | Ohara |
| 2006/0240677 A1 | 10/2006 | Horii et al. |
| 2006/0286306 A1 | 12/2006 | Ohara et al. |
| 2007/0009673 A1 | 1/2007 | Fukazawa et al. |
| 2008/0220619 A1 | 9/2008 | Matsushita et al. |
| 2009/0053906 A1 | 2/2009 | Miya et al. |
| 2009/0093134 A1 | 4/2009 | Matsushita et al. |
| 2009/0093135 A1 | 4/2009 | Matsushita et al. |
| 2009/0305515 A1 | 12/2009 | Ho et al. |
| 2010/0143609 A1 | 6/2010 | Fukazawa et al. |
| 2012/0060752 A1 | 3/2012 | Kiyotoshi et al. |
| 2014/0065841 A1 | 3/2014 | Matero |
| 2014/0302687 A1 | 10/2014 | Ashihara et al. |
| 2015/0111396 A1* | 4/2015 | Chan .................... C23C 16/045 438/798 |

FOREIGN PATENT DOCUMENTS

| | | |
|---|---|---|
| WO | WO 2013/094680 | 6/2013 |
| WO | WO 2013/148262 | 10/2013 |
| WO | WO 2014/014511 | 1/2014 |

OTHER PUBLICATIONS

Liu et al. "A Simple Gate-Dielectric Fabrication Process for AlGaN/GaN Metal-Oxide-Semiconductor High-Electron-Mobility Transistors", IEEE Electron Device Letters, vol. 33, No. 7, Jul. 2012.

* cited by examiner

US 9,431,238 B2

REACTIVE CURING PROCESS FOR SEMICONDUCTOR SUBSTRATES

REFERENCE TO RELATED APPLICATION

This application claims the priority benefit under 35 U.S.C. §119(e) of provisional Application No. 62/008,404, filed Jun. 5, 2014, the entire disclosure of which is incorporated herein by reference.

FIELD

This disclosure relates to semiconductor processing and, more particularly, to a reactive curing processes.

BACKGROUND

Oxidizing ambients are commonly used in semiconductor processing. For example, oxidizing ambients may be used to supply oxygen to cure materials on a semiconductor substrate. These oxidizing ambients have conventionally included oxygen, steam, or ozone. As process parameters and materials change, there is a continuing need for the development of processes with oxidizing ambients that meet the challenges presented by the changing parameters and materials.

SUMMARY

In some embodiments, a method for semiconductor processing is provided. A semiconductor substrate in a process chamber is exposed to an ambient containing $H_2O_2$. During the exposure, the pressure in the process chamber is at about 300 Torr or below. In some embodiments, the pressure is about 150 Torr or below.

In some embodiments, a method for semiconductor processing is provided in which a semiconductor substrate is provided in a process chamber. $H_2O_2$ species are flowed into the process chamber to expose the semiconductor substrate to an $H_2O_2$ ambient. Simultaneously with flowing the $H_2O_2$ species into the process chamber, gases are exhausted from the process chamber. The conditions of flow, chamber pressure and chamber temperature are such that the average residence time of the $H_2O_2$ species in the reaction chamber is below about 5 minutes, or below about 2 minutes.

In some embodiments, a method of manufacturing a semiconductor device on a semiconductor substrate is provided. The method comprises depositing a flowable dielectric film on the substrate using a carbon-free silicon source and a remote $NH_3$ plasma, without addition of oxygen to form a low oxygen content film. The substrate with the low oxygen content film is loaded into a process chamber. The substrate is exposed to hydrogen peroxide to cure the low oxygen content film. In some embodiments, exposing the substrate to hydrogen peroxide is performed within about 25 minutes, or within about 8 minutes, of completing loading the substrate. In some embodiments, the low oxygen content film may have less than about 10%, less than about 3%, or less than about 1% oxygen.

The exposure to the hydrogen peroxide ambient may be utilized to add oxygen to materials on the semiconductor substrates, for example, providing a reactive cure of flowable dielectric materials.

DETAILED DESCRIPTION

Figure 1:
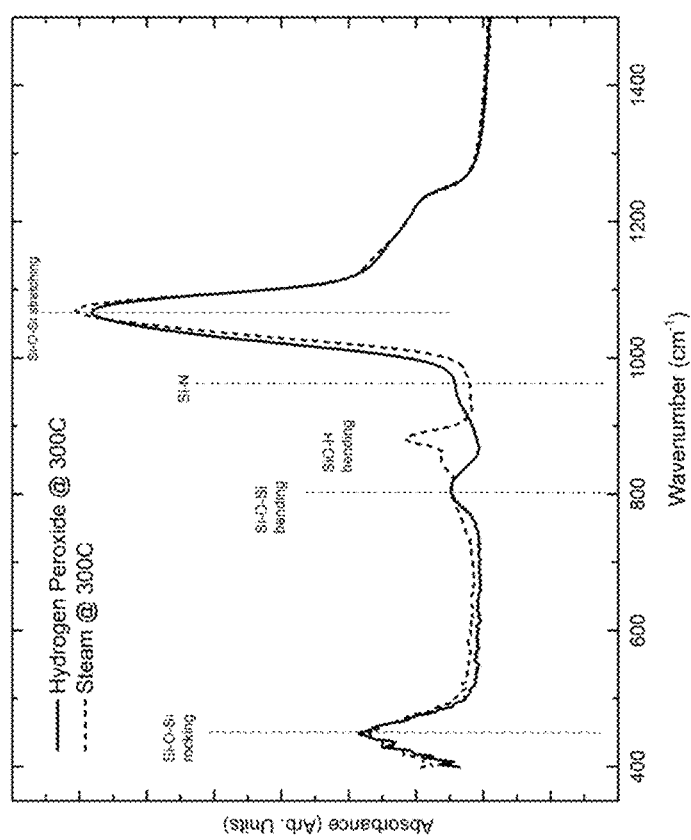
FIG. 1 shows FTIR scans of flowable dielectric films cured at 300° C. with, respectively, hydrogen peroxide and steam.

The fabrication of semiconductor devices can involve the curing of materials on a semiconductor substrate or wafer. In a reactive curing process, chemical species may be removed from the materials and some chemical species may also be added to those materials. Some curing process may be performed by exposing the semiconductor substrates to an oxidizing ambient in a process chamber at atmospheric pressure. Due to various factors, such as compatibility with and guarding against damage to materials on semiconductor substrates, it may be desirable to use low temperatures for curing materials, such as below about 500° C., or below about 400° C., or even below about 300° C. It has been found, however, that as temperatures for the curing process decrease, the reactivity of oxidizing species in the oxidizing ambient may also decrease and conventional oxidizers, such as oxygen, ozone and/or water, may not be sufficiently reactive.

Hydrogen peroxide, $H_2O_2$, provides a higher effective reactivity than oxygen, steam, or ozone for use in curing processes, particularly for those cures using low temperature oxidizing ambients. A cure using hydrogen peroxide may be reactive at temperatures of about 500° C. or below. However, the use of hydrogen peroxide to establish an oxidizing ambient has been found to cause unacceptably non-uniform curing results.

Conventionally, for ease of processing, curing processes have been performed at atmospheric pressure. Without being limited by theory, it has been found that such pressures may actually cause the non-uniform curing results. This is believed to be due to the relatively high reactivity of the hydrogen peroxide, in combination with a relatively limited life time of the $H_2O_2$ molecule, in comparison to some conventional oxidizers.

Advantageously, in some embodiments, highly uniform curing results may be achieved using hydrogen peroxide. In some embodiments, a cure may be performed by exposing a semiconductor substrate in a process chamber to an ambient containing hydrogen peroxide, with the pressure in the process chamber at about 300 Torr or less, about 150 Torr or less, or about 125 Torr or less, including about 100 Torr. In some embodiments, the residence time, or average durations of particular hydrogen peroxide molecules in the process chamber—the durations between the molecules being introduced and then removed from the process chamber—is about 5 minutes or less, about 2 minutes or less, or about 1 minute or less. In some embodiments, the substrate may include a low oxygen content, flowable dielectric film and the exposure to an ambient containing hydrogen peroxide is performed directly after completing loading the substrate into the process chamber and pump-down of the system to the curing pressure, e.g., within about 25 minutes, within about 15 minutes, or within about 8 minutes of the completion of loading. In some embodiments, for the above noted pressures and/or residence times, the curing process temperature may be set at about 500° C. or less, about 400° C. or less, or about 300° C. or less, while also being higher than about 50° C., about 100° C., or about 150° C. Advantageously, in some embodiments, the hydrogen peroxide ambient provides curing results that provide a high degree of uniformity over the wafer, with film properties such as refractive index and etch rate having a non-uniformity of 5% 1 sigma or less, 2% 1 sigma or less, or more preferably 1% 1 sigma or less.

The curing processes may be performed in various types of process chambers and have particular benefits in the large volumes of batch process chambers. In some embodiments, the batch process chambers may be configured to accommodate 20 or more, 50 or more, or 100 or more semiconductor substrates.

Without being limited by theory, it is believed that a low pressure and/or low residence time, as disclosed herein, can provide various advantages. For example, a first advantage of the low pressure is that the residence time of hydrogen peroxide species can be made shorter, with the low pressure allowing the hydrogen peroxide species to move more quickly and freely through the process chamber. As a result, the impact of the decomposition of the peroxide species on the partial pressure of hydrogen peroxide in the process chamber is reduced and a higher concentration and more uniform distribution of hydrogen peroxide species can be established throughout the volume of the process chamber.

A second advantage of the low process pressure and quick movement of hydrogen peroxide species through the process chamber is that the transport of all chemical species in the gas phase may also be quick. Not only is the diffusion transport of the reactive hydrogen peroxide at a high level, but so is the transport of chemical species, such as nitrogen-containing species, escaping from the material to be cured. Therefore, the effective partial pressure of the escaping species is lower in the atmosphere directly adjacent to the material, resulting in more effective curing and removal of those species. Due to the improved diffusion transport, in batch process chambers, a smaller substrate pitch (the distance between substrates held in the process chamber) can be applied, resulting in a larger batch size in the process chambers, thereby improving manufacturing efficiencies without affecting the uniformity of the curing results.

A third advantage of the low curing pressure is that the effective pressure of the hydrogen peroxide may be set higher than in cures with a higher process chamber pressure. The thermal decomposition of hydrogen peroxide is an exothermic reaction and, in the case of a run-away decomposition reaction, the pressure in the reactor will substantially increase since the decomposition of the $H_2O_2$ may result in an increase of the number of gas molecules by 50% ($2H_2O_2 \rightarrow 2\ H_2O+O_2$), in combination with the thermal expansion of the gas due to the amount of heat released by the reaction. Therefore, the lower process pressures provided by some embodiments can be safer than curing processes performed at conventional pressures.

In some embodiments, the hydrogen peroxide cure may be followed by an anneal at higher temperature, e.g., such that an exposed film is subjected to the hydrogen peroxide cure and then to the anneal. The anneal is preferably conducted in inert gas, such that the substrate is accommodated in an inert gas ambient. In some embodiments, the hydrogen peroxide cure is performed at about 500° C. or below, and the anneal is performed at higher temperature, e.g., above 500° C. More preferably, the hydrogen peroxide cure is performed at about 300° C. or below, and the anneal is performed at higher temperature of about 400-800° C. In some embodiments, the anneal may be followed by another hydrogen peroxide cure, such that the exposed film is subjected to a hydrogen peroxide cure after the anneal. Without being limited by theory, it is believed that the anneal advantageously removes hydrogen from the film and further improves the density of the hydrogen peroxide cured film, without oxidizing the underlying substrate. Also without being limited by theory, it is believed that the film may show increased susceptibility for oxidation after the anneal, and performing the subsequent hydrogen peroxide cure after the anneal may be beneficial in view of this increased susceptibility.

In some embodiments, the anneal may be performed in an atmosphere that includes inert gas and oxygen, e.g., a small percentage or trace amounts of oxygen. Depending on the temperature and duration of the inert gas anneal, oxygen may be tolerated without significant oxidation of the underlying substrate due to the limited reactivity of oxygen at these temperatures and durations.

In some embodiments, a substrate is exposed to $H_2O_2$ during a hydrogen peroxide cure for a process time of about 10 minutes to about 10 hours, about 20 minutes to about 6 hours, or about 30 minutes to about 3 hours.

It will be appreciated that the concentration of $H_2O_2$ delivered from $H_2O_2$ source containers may vary over time. In some embodiments, $H_2O_2$ is provided to the process chamber using a supply system described in a related application of the present Applicant: U.S. Provisional Patent Application No. 61/972,005, entitled METHOD AND SYSTEM FOR DELIVERING HYDROGEN PEROXIDE TO A SEMICONDUCTOR PROCESSING CHAMBER and filed Mar. 5, 2014, the entire disclosure of which is incorporated herein by reference. As discussed in that provisional patent application, the $H_2O_2$ may be metered as a liquid upstream of the process chamber, and the liquid may then be evaporated in an evaporator, and flowed into the process chamber. The evaporation occurs at a temperature, e.g., about 120° C. or less, or about 120° C. to about 40° C., or about 100° C. to about 60° C., that is sufficient to evaporate the $H_2O_2$ and is also below the boiling point of the $H_2O_2$. Such an evaporation temperature has been found to provide a high level of consistency in the concentration of $H_2O_2$ delivered to the process chamber. In some embodiments, the vapor feed line between the evaporator and the processing chamber may be provided with a heater and heated, e.g., to a temperature equal to or higher than the evaporator temperature. In some embodiments, the vapor feed line may be provided with a filter, which may also be heated, e.g., to a temperature equal to or higher than the evaporator. The filter may have a removal rating of >30 nm, which is a measure of the effectiveness of the filter in relation to particle size. It has been found that such a filter can reduce the occurrence of particles on the cured semiconductor substrate.

It will be appreciated that the hydrogen peroxide-based curing process can have particular advantages for curing flowable dielectric materials. In some applications, such flowable dielectric materials can be deposited as films and may be used for seamless gap fill of structures in semiconductor devices. As an example, deposited flowable dielectric films may include silicon, nitrogen, hydrogen and/or oxygen, and, depending on the precursors used, may also include carbon. In some cases, the films may be formed by chemical vapor deposition or atomic layer deposition using a precursor comprising silicon and nitrogen, in combination with a plasma, e.g., a remote plasma, of $NH_3$. An example of a precursor comprising silicon and nitrogen is tri-silyl amine (TSA), which is a carbon-free precursor. With such a carbon-free precursor, the resulting film will not contain any carbon or will contain only residual traces of carbon. Other silyl-amines or amino-silanes may also be used. During the deposition of the flowable dielectric film, oxygen may be added to form a film with relatively high as-deposited oxygen content. A film with a relatively high as-deposited oxygen content may also be formed by an ozone cure clustered with the deposition process and performed immediately after deposition. Alternatively, the films may be deposited without feeding oxygen into the process chamber during the deposition, to form a film with relatively low as-deposited oxygen content. In such an alternative, a film with low oxygen content may be obtained due to the incorporation of residual oxygen that is present in the process chamber and/or as residual oxygen in the gases used during the deposition. The low oxygen content film may have less than about 10%, less than about 3%, or less than about 1% oxygen. Whether the films have a relatively low or a relatively high oxygen content, after the deposition, the films may need to be cured in an oxygen-containing ambient, a hydrogen peroxide-containing ambient in some embodiments, to obtain a film with higher density and good quality.

In some embodiments, the flowable dielectric material may be modified to form a silicon dioxide material by performing a reactive cure, such as disclosed herein. During the reactive cure, carbon, hydrogen and nitrogen leave the material and oxygen (additional oxygen where the dielectric material already contains oxygen) is supplied to the material. Due to temperature limitations of and temperature sensitivities of electronic devices on the semiconductor substrates, the reactive cure is preferably performed at temperatures below about 500° C., or below about 400° C., or even below about 300° C.

Experiments

As discussed further below, various Figures document experiments for curing processes utilizing hydrogen peroxide and other oxidizers, respectively. The curing processes were performed in an A412™ vertical furnace available from ASM International N.V. of Almere, the Netherlands. The furnace has a process chamber that can accommodate a load of 150 semiconductor substrates, or wafers, having a diameter of 300 mm, with the substrates held in a wafer boat. $H_2O_2$ was provided to the process chamber using the hydrogen peroxide supply system described in U.S. Provisional Patent Application No. 61/972,005, as discussed herein.

Flowable dielectric films were deposited without addition of oxygen during the deposition, unless otherwise specified. The films were by deposited by CVD using tri-silyl amine (TSA) in combination with a $NH_3$ remote plasma.

The as-deposited films were subjected to a curing processing in either a steam or hydrogen peroxide-containing ambient, with different batches of substrates subjected to the curing process at temperatures of 300° C., 400° C., and 500° C., respectively, for 6 hours each. A wafer boat was loaded with wafers and the wafer boat was loaded into the process chamber. The process chamber was heated to 300° C. and an oxygen flow was applied through the process chamber during loading of the wafer boat. The oxygen flow was switched off when the steam or hydrogen peroxide flow, for curing, was switched on. For some cures, as discussed herein, the process chamber was heated to temperatures higher than 300° C., and temperature stabilization occurred while an oxidizing gas was fed into the reactor. The process chamber pressure for the steam cures was atmospheric pressure, and for the $H_2O_2$ it was 100 Torr.

Figure 2:
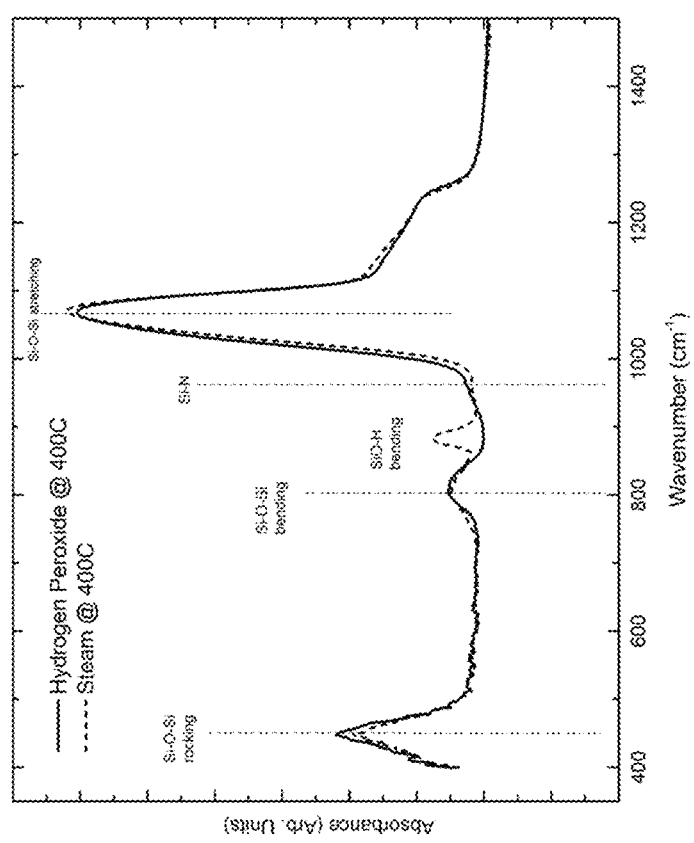
FIG. 2 shows FTIR scans of flowable dielectric films cured at 400° C. with, respectively, hydrogen peroxide and steam.
Figure 3:
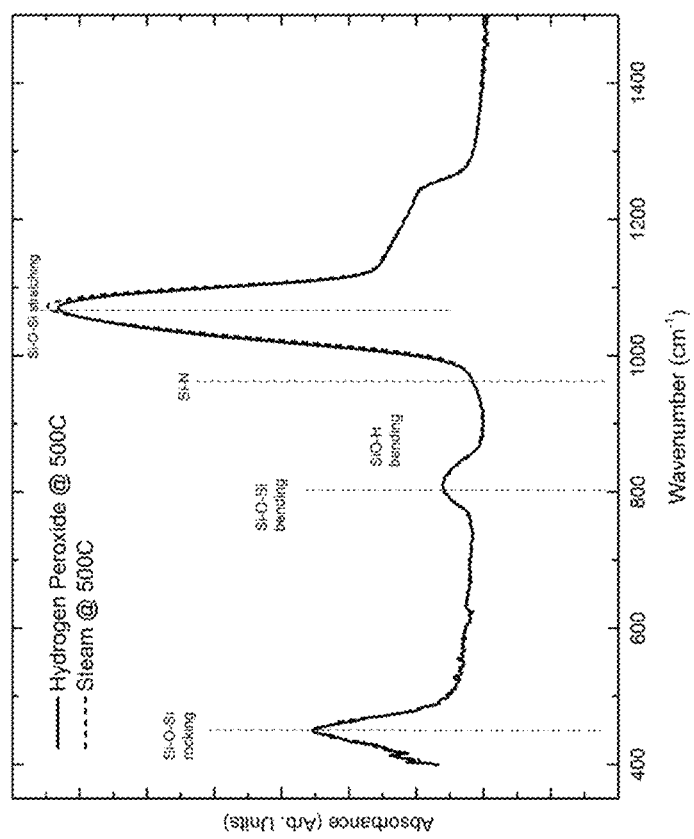
FIG. 3 shows FTIR scans of flowable dielectric films cured at 500° C. with, respectively, hydrogen peroxide and steam.

FIGS. 1, 2, and 3 show FTIR spectra of the flowable dielectric films after curing processes conducted at 300° C., 400° C., and 500° C., respectively, using hydrogen peroxide and steam has oxidizers. At 300° and 400° C. (FIGS. 1 and 2), the steam anneal was not effective in reducing the SiO—H bond peak at about 890 cm-1, although the steam anneal was effective in removing the Si—N bond peak at about 960 cm-1. At 500° C., the FTIR spectra of the films annealed in steam and hydrogen peroxide were similar.

Figure 4:
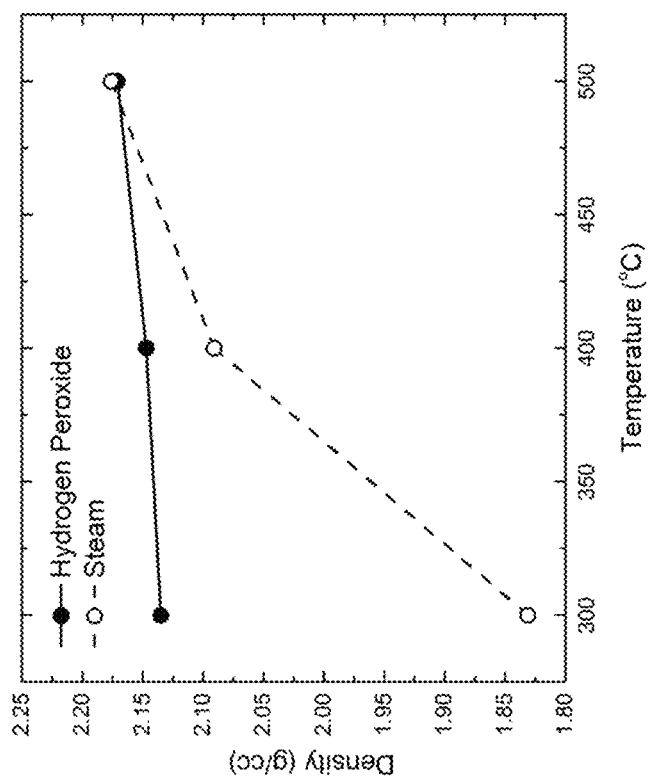
FIG. 4 shows a graph of the density of a flowable dielectric material film as a function of curing temperature for hydrogen peroxide and steam cures.

The densities of the films of FIGS. 1-3 are shown in FIG. 4. For the hydrogen peroxide cure, a relatively high film density was already obtained for a curing temperature as low as 300° C. Increasing the temperature to 500° C. increases the density further. On the other hand, the steam cure at 300° C. results in a substantially lower density (about 17% lower) than the $H_2O_2$ cure at the same temperature. Only after increasing the cure temperature to 500° C., did the densities of the films, after curing in steam and hydrogen peroxide, become comparable.

Figure 5:
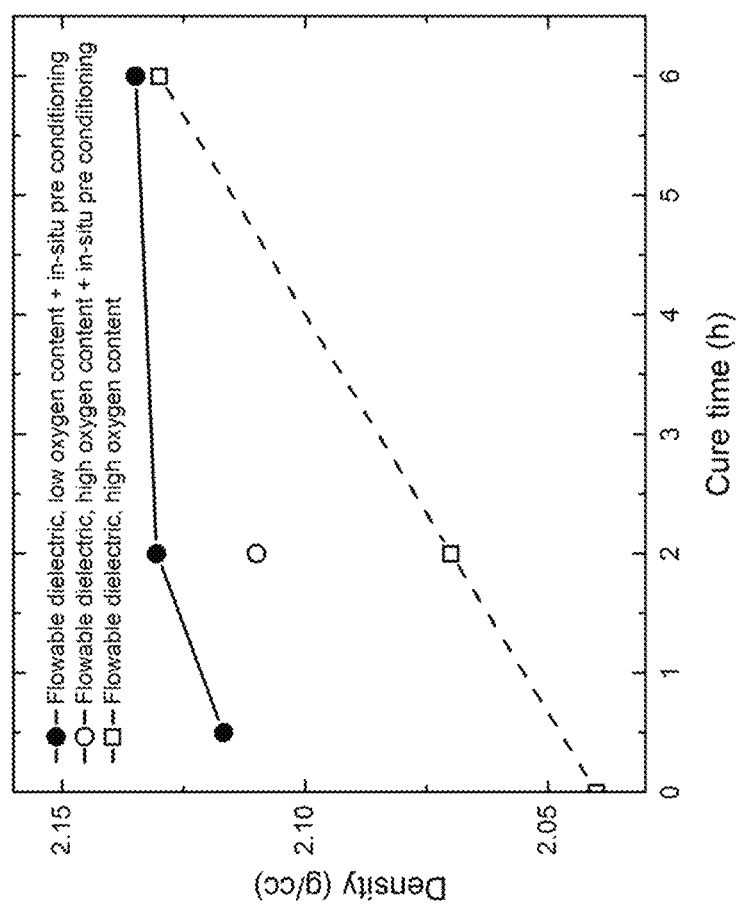
FIG. 5 shows a graph of the density of three different types of flowable dielectric materials as a function of curing temperature.

In FIG. 5, film density as a function of curing time at 300° C. in hydrogen peroxide is shown for three different sets of samples. The first sample set was a flowable dielectric with relatively low, as-deposited oxygen content, deposited under the same conditions as the samples for which the experimental results are shown in FIGS. 1-4. The second and third sample sets were a flowable dielectric deposited under the same conditions as the first sample set but the second and third sets received an $O_3$ cure immediately after deposition and before the $H_2O_2$ cure and as such had a relatively high oxygen content before the $H_2O_2$ cure. Further, as indicated in FIG. 5, for the first and second sets, an in-situ pre-condition was applied, which means that an oxygen flow was applied through the process chamber during loading of the boat into the chamber and, if applicable, during heat-up to the curing temperature if the curing temperature is higher than the loading temperature. A remarkable difference in curing behavior between the two different types of films was observed: the flowable dielectric films with low oxygen content appear to have nearly achieved the desired maximum density and to have completed the curing process after only 2 hours of curing at 300° C., whereas for the flowable dielectric film having received an $O_3$ cure before the $H_2O_2$ cure, the $H_2O_2$ cure was not completed (that is, did not reach a similar density) after 2 hours and needed 6 hours of curing to achieve the same density. Further, the presence or absence of oxygen during the loading of the boat appears to have a significant effect on the film density: for the films with a high oxygen content the film density is lower when the boat is loaded into the furnace without oxygen added as compared to when the boat is loaded with oxygen added.

The density of as-deposited flowable dielectric films with low oxygen content without any anneals could not be measured, but, in another experiment, the density after 6 hours of curing in steam is shown in FIG. 4 and was found to be low, at 1.83 g/cm³. It is believed that the density of the as-deposited low oxygen content film may be even lower. Although the density of the flowable dielectric with high as-deposited oxygen content is initially higher (at about 2.04 g/cm$^3$, after a few hours of exposure to ambient air) than that of the low as-deposited oxygen content material, high as-deposited oxygen content material still requires a longer curing time to achieve the maximum density in comparison to the low as-deposited oxygen content material. Consequently, it was found that it may be advantageous and may provide a shorter curing time if the flowable dielectric film were deposited with a low as-deposited oxygen concentration, and then exposed to hydrogen peroxide to increase the oxygen content and to increase the density and quality of the film, without performing any other cure, such as a cure with $O_3$, in between the deposition of the film and the $H_2O_2$ cure. Further, it appeared to be beneficial to provide an oxygen flow during loading of the samples into the furnace.

It was found that long stabilization times such as 30 minutes at 300° C., or at higher curing temperatures, under a nitrogen flow or a mixture of nitrogen and oxygen flow resulted in lower film densities and/or longer curing times compared to processes wherein the hydrogen peroxide flow was started without such a delay. Consequently, in some embodiments, the hydrogen peroxide flow is switched on directly after completion of the loading of a substrate in the process chamber without unnecessary delay. In some embodiments, the hydrogen peroxide is flowed into the process chamber within about 25 minutes, within about 15 minutes, or within about 8 minutes of the completion of loading a substrate in the process chamber.

Figure 6:
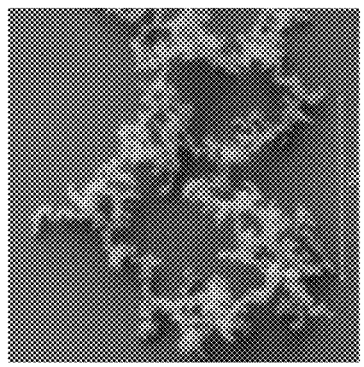
FIG. 6 shows a Scanning Electron Micrograph (SEM) of a flowable dielectric material with polymerization defects caused by out-gassing.

FIG. 6 is a Scanning Electron Micrograph of defects formed on the surface of flowable dielectric film with a low as-deposited oxygen content under conditions wherein the loading of the samples into the furnace and the ramp-up to a curing temperature of 400° C. was performed in an $N_2$ ambient without the intentional addition of oxygen gas. Such defects may be avoided by loading of the samples into the process chamber and ramp-up to the curing temperature in an oxidizing ambient, e.g., with an oxygen flow through the process chamber, according to some embodiments.

With the process conditions noted above, the volume of the reactor used (about 160 liter) and assuming a process temperature of 300° C., the residence time of the gas in the reactor was about 44 seconds. In an exemplary process, the following conditions were used:

| | |
|---|---|
| $N_2$ flow | 5 slm |
| $H_2O$ flow | 7 slm |
| $H_2O_2$ flow | 1.6 slm |
| Pressure | 100 Torr |
| Temperature | 100° C.-500° C. |

Figure 7:
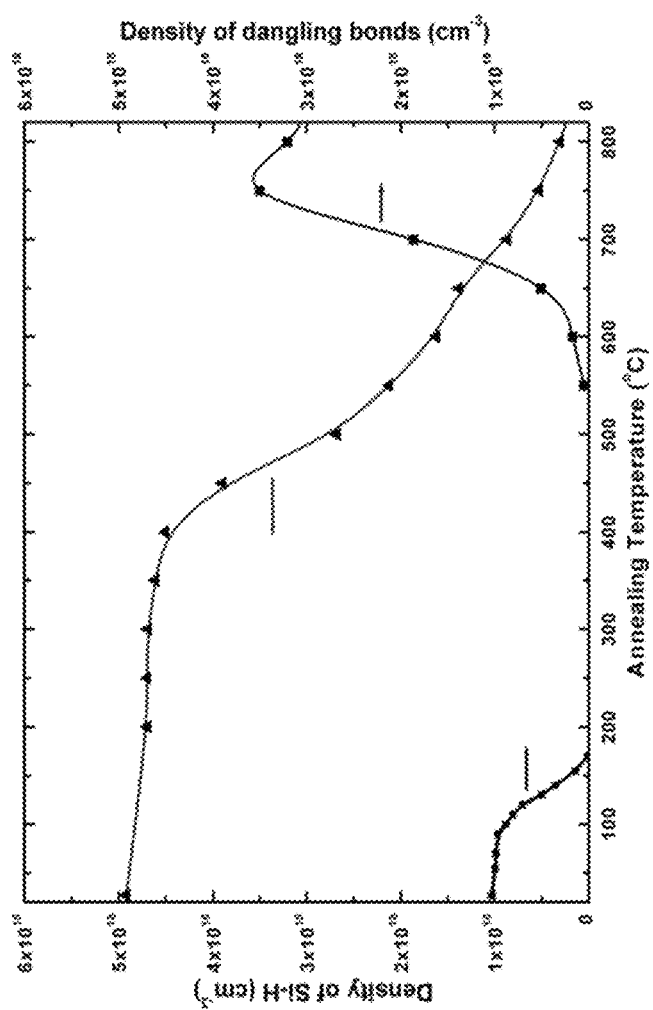
FIG. 7 shows a graph of the density of Si—H bonds and dangling bonds as a function of anneal temperature.

In another set of experiments, investigations were made of the effects of annealing the flowable dielectric films after subjecting the films to a $H_2O_2$ cure. In particular, the effect of an inert gas anneal on hydrogen content and density of dangling bonds, and on etch resistance, was investigated. FIG. 7 shows a graph of the density of Si—H bonds and dangling bonds as a function of anneal temperature. It will be appreciated that the Si—H density is indicative of hydrogen content.

The flowable dielectric films were subjected to a $H_2O_2$ cure at 200° C. for 2 hours. Then the temperature was increased to an annealing temperature and the films were annealed in $N_2$ for 0.5 hours at the annealing temperature. With reference to FIG. 7, it can be seen that starting from about 400° C. the hydrogen content decreases and from about 650° C. onwards the number of dangling bonds starts to increase. Annealing temperatures in the range from about 400° C. to about 800° C. provided usefully low hydrogen content. It will be appreciated that during both the $H_2O_2$ cure and the anneal, the flowable dielectric films were exposed and were not subjected to any other treatments (including depositions or etches) between the $H_2O_2$ cure and the anneal.

Figure 8:
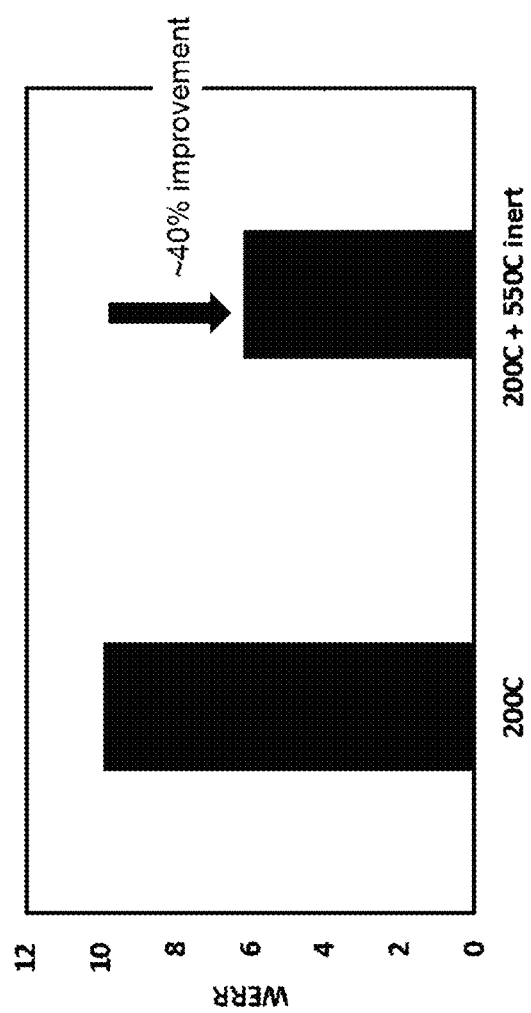
FIG. 8 shows a graph comparing Wet Etch Rate Ratios (WERRs) for films that were not anneal and films that were annealed.

FIG. 8 shows a graph comparing Wet Etch Rate Ratios (WERRs) for films that were not anneal and films that were annealed. The anneal was conducted at 550° C. in an inert gas atmosphere. The Wet Etch Rate Ratio (WERR) was determined. It will be appreciated that the WERR is a ratio of the wet etch rate of the film under evaluation (the annealed flowable dielectric film) and the wet etch rate of thermal silicon oxide under the same etching conditions. Advantageously, a reduction in WERR of 40% was obtained.

It will be appreciated that various modifications and refinements to the embodiments disclosed herein may be made. In some embodiments, by providing a short residence time, a reduction of the $H_2O_2$ concentration due to decomposition in the process chamber is counteracted and the $H_2O_2$ concentration remains at a relatively high level. It will be appreciated that, at elevated temperatures, the hydrogen peroxide decomposes faster and the preferred residence time may be shorter. A shorter residence time can be achieved by a lower pressure and/or higher gas and vapor flows. A lower pressure will also reduce the $H_2O_2$ partial pressure and, consequently, reduce the reactivity of the curing process. In some applications, it was found that a $H_2O_2$ partial pressure below 1 Torr of the gas mixture fed to the reactor may be not sufficient for effective curing. The $H_2O_2$ partial pressure of the gas mixture fed to the reactor is preferably about 1 Torr or more, more preferably about 3 Torr or more, more preferably about 10 Torr or more, and may be up to about 60 Torr in some embodiments. Depending on the process temperature, a reactor pressure may exist where the reactive curing process is most effective. In some embodiments, with a temperature range from about 150° C. to about 350° C., it was found that a pressure in the range between about 50 to about 200 Torr was particularly effective. In one example, the process pressure may be about 100 Torr. In the lower end of the temperature region, including about 50°-150° C., in some embodiments, process pressures up to about 300 Torr may be used.

In some embodiments, the pressure in the process chamber may be reduced to the desired curing pressure. During the curing step, the curing pressure may remain substantially constant or may be varied. It was found that evacuating the process chamber to the base pressure before starting the hydrogen peroxide flow at the curing pressure had a detrimental effect on curing efficiency. Preferably, the flowable dielectric is not exposed to pressures below 10 Torr, more preferably it is not exposed to pressures below 50 Torr, before the hydrogen peroxide flow is started. In some embodiments, the curing pressure is 100 Torr and the flowable dielectric is not exposed to lower pressures than 100 Torr before it is exposed to hydrogen peroxide.

In some embodiments, the reactor temperature may be set at a low level at the start of the cure while the curing pressure can be relatively high. The relatively high pressure is believed to encourage the diffusion of reactive species into the flowable dielectric material, while the relatively low temperature prevents a top part of the top film from closing in an early stage of the cure. During the course of the cure, the temperature may be increased to achieve more complete curing while the pressure may be reduced. Consequently, it will be appreciated that the process conditions are not constant but may be dynamically adjusted during the cure.

In some other embodiments, the flowable dielectric material, disposed on a semiconductor substrate and having a relative low oxygen concentration, may be exposed to an oxidizing gas during the loading of the wafers into the reactor and/or during the heat-up to a first curing temperature. The oxidizing gas may be water, oxygen, hydrogen peroxide, or ozone. It is believed that this oxidizing gas is effective in preventing the creation of the defects such as shown in FIG. 6. Without being limited by theory, it is believed that components of the flowable dielectric materials may evaporate or out-diffuse from the material. Polymerization of those components may occur in the gas phase, creating larger species that are re-deposited on the wafer surface and that are observed as the defects shown in FIG. 6. The addition of the oxidizing gas is believed to prevent the polymerization of the species that escape into the gas phase from the dielectric material. This was evidenced by particle measurement with an SP3 particle counter of KLA-Tencor where a data overload, indicating extremely high defect concentration, was observed for flowable dielectric materials having a low as-deposited oxygen concentration that were loaded in an $N_2$ ambient without intentional addition of oxygen. When an oxygen flow was fed to the process chamber during loading and heat-up of the chamber, it was found that the number of detected defects was reduced to very low levels.

In some embodiments, semiconductor substrates having a flowable dielectric material with a low as-deposited oxygen concentration may be loaded into the process chamber at a relatively low loading temperature, below about 300° C., below about 200° C., below about 100° C., or even below about 65° C. (while being above room temperature). The hydrogen peroxide cure is started at this low temperature and after a period of time the process chamber temperature may be increased to the required curing temperature. Not being wanted to be limited by theory, the reduced loading temperature may be sufficiently low that no significant out-diffusion or evaporation of species from the dielectric material may occur and, thus, no defects are formed. Once the oxidizing curing ambient is established in the process chamber, the process chamber temperature can be increased from the loading temperature to the curing temperature without a risk of forming defects.

In some embodiments, semiconductor substrates having a flowable dielectric material may be exposed, after a period of curing, to a low pressure vacuum of about 100 Torr or below, or about 10 Torr or below, or about 1 Torr or below. The semiconductor substrates may be exposed to the low pressure in a cycling mode, with periods of lower pressure alternated by periods of curing at higher pressure where the substrates are exposed to reactive hydrogen peroxide species. The low pressure exposures may enhance the outflow of the species which need to be removed from the dielectric material. It will be appreciated that the flow of hydrogen peroxide into the process chamber may be continued during exposure to the low pressures, in some embodiments.

In some embodiments, additional oxidizing gases may be added to the hydrogen peroxide gas. Non-limiting examples of such oxidizing gases include ozone, oxygen, water, and combinations thereof. The additional oxidizing gases may be provided in the process chamber at a constant partial pressure, or the partial pressure may be varied dynamically during the cure. In some embodiments, rather than adding the additional oxidizing gases to the hydrogen peroxide gas, the additional oxidizing gases may be provided to semiconductor substrates sequentially and alternatively with the hydrogen peroxide gas. For example, a curing cycle may be performed in which hydrogen peroxide and the additional oxidizing gas are flowed to the semiconductor substrates at different times, one after the other, and then the cycle may be repeated. Without being limited by theory, it is believed that, in some applications, one oxidizing gas may be effective in one aspect of the curing process and another oxidizing gas may be effective in another aspect of the curing process. For example, the FTIR graphs (FIGS. 1-3) indicate that steam may be effective in removing nitrogen from the flowable dielectric material, even at low temperatures, whereas hydrogen peroxide may be more effective in removing SiO—H bonds from the material.

In some other embodiments, the hydrogen peroxide curing time may be reduced, while providing high film quality, by using flowable dielectric films with a low as-deposited oxygen concentration, and/or by providing oxygen during loading of semiconductor substrates containing the flowable dielectric films into the process chamber and during heat-up, and/or by avoiding exposure of the semiconductor substrates to a pressure below the curing pressure. In some embodiments, the curing time may be about 4 hours, about 3 hours or less, or about 2 hours or less. In some embodiments, such curing times may provide a film density of about 2.075 $g/cm^3$ or higher, or about 2.10 $g/cm^3$ or higher.

In some embodiments, hydrogen may be added to the cure to improve the removal of the carbon and the nitrogen from the flowable dielectric material.

In some embodiments, nitrogen is not added to the process chamber during the exposure to hydrogen peroxide, or, in some cases, nitrogen is absent from any part of the curing process. Nitrogen gas may be replaced by a different inert gas, such as argon, or by oxidizing gases, such as oxygen, steam or ozone. In such an embodiment, in which nitrogen gas is replaced by an oxidizing gas, the carrier gas for the hydrogen peroxide is replaced by the oxidizing gas.

While embodiments disclosed herein may advantageously be applied to cure flowable dielectric materials, it will be appreciated that the curing process disclosed herein also may be applied to provide oxygen to various other materials. For example, the curing process may be applied for oxidation of silicon, germanium or III-V semiconductors, or for curing of low-quality films, such as low-quality silicon dioxide films.

In some embodiments, the curing process may be applied in combination with a process for depositing a silicon material, a germanium material, or a III-V semiconductor material. For example, the curing process may be integrated into the deposition in a cyclical way: after deposition of a thin film (e.g., ranging from 1 Å to 10 Å thick), the curing process may be applied to oxidize the deposited film at a relatively low temperature, and the deposition and curing steps may be repeated until an oxide film of a desired thickness is formed. For example, a 5 Å film may be deposited at 390° C. using trisilane ($Si_3H_8$) as a silicon precursor and the film may be oxidized by exposure to hydrogen peroxide, e.g., at temperatures ranging from 200° C. to 400° C. for a duration of, e.g., 0.5 hrs to 6 hrs. It was found that at the lower part of this temperature range (200° C. to 300° C.) the oxidation rate was higher than the oxidation rate in steam. Although for silicon the oxidation rate may be relatively low, for Ge and II-V semiconductors the oxidation rate is higher and the disclosed curing process using hydrogen peroxide for oxidation has the advantage of forming an oxide of relatively high quality at relatively low temperature. This low temperature oxide formation provides a significant advantage for materials that have oxides with relatively low thermal stability, such as Germanium and III-V oxides.

In some embodiments, the exposure of a substrate to $H_2O_2$ is performed at a first temperature and is followed by an anneal in an inert gas at a second temperature, which is higher than the first temperature. For example, the first temperature may be 500° C. or lower and the second temperature may be higher than 500° C.

Accordingly, it will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for semiconductor processing, comprising:
   providing a plurality of semiconductor substrates in a hot wall, batch process chamber of a vertical furnace, wherein the semiconductor substrates are held in a wafer boat;
   exposing the semiconductor substrates in the process chamber to an ambient containing $H_2O_2$; and
   providing a pressure in the process chamber at about 300 Torr or below while exposing the substrate.

2. The method of claim 1, wherein the pressure is about 150 Torr or below.

3. The method of claim 1, wherein a partial pressure of $H_2O_2$ in the process chamber is about 1-100 Torr.

4. The method of claim 1, wherein the process chamber is at a process temperature of about 50° to about 500° C. during exposing the semiconductor substrate.

5. The method of claim 1, wherein a residence time of $H_2O_2$ in the process chamber is about 5 minutes or less.

6. The method of claim 1, wherein a flowable dielectric film is disposed on the substrate.

7. The method of claim 6, wherein the dielectric film is a film comprising silicon, nitrogen, oxygen, and/or hydrogen.

8. The method of claim 6, wherein the ambient further comprises hydrogen, wherein exposing the semiconductor substrate removes nitrogen from the dielectric film.

9. The method of claim 1, further comprising:
   metering the $H_2O_2$ as a liquid upstream of the process chamber;
   evaporating the liquid in an evaporator; and
   flowing the evaporated $H_2O_2$ into the process chamber, wherein the evaporator is maintained at a temperature of 120° C. or below while evaporating the liquid.

10. The method of claim 1, wherein the ambient further comprises one or more additional oxidizing species different from $H_2O_2$, wherein the additional oxidizing species is chosen from the group consisting of ozone, oxygen, and $H_2O$.

11. The method of claim 1, further comprising evacuating the process chamber to reduce a pressure in the process chamber down to a curing pressure, wherein the process chamber is not evacuated below 50 Torr before commencing exposing the semiconductor substrate.

12. The method of claim 1, further comprising exposing the semiconductor substrate to $O_2$ while loading the semiconductor substrate into the process chamber and/or during heat-up of the semiconductor substrate, wherein loading the semiconductor substrate is performed at a relatively low process chamber temperature, wherein the process chamber temperature increases after starting exposing the semiconductor substrate.

13. The method of claim 1, further comprising providing cyclically alternating oxidizing gases in the process chamber during exposing the semiconductor substrate,
   wherein providing cyclically alternating oxidizing gases comprises performing a plurality of cycles, each cycle comprising:
      sequentially exposing the semiconductor substrate to a first oxidizing gas comprising hydrogen peroxide and a second oxidizing gas comprising one or more gases selected from the group consisting of steam, ozone, and oxygen.

14. A method for semiconductor processing, comprising:
   providing a plurality of semiconductor substrates in a hot wall, batch process chamber of a vertical furnace, wherein the semiconductor substrates are held in a wafer boat;
   flowing $H_2O_2$ species into the process chamber to expose the semiconductor substrate to an $H_2O_2$ ambient; and
   exhausting gases from the process chamber, wherein the conditions of flow, chamber pressure, and chamber temperature are such that the average residence time of the $H_2O_2$ species in the process chamber is below about 5 minutes.

15. The method of claim 14, wherein the conditions of flow, chamber pressure and chamber temperature are such that the average residence time of the $H_2O_2$ species in the reaction chamber is below about 2 minutes.

16. The method of claim 14, further comprising depositing a dielectric material on the semiconductor substrate before flowing the $H_2O_2$ species into the process chamber, wherein exposing the semiconductor substrate to the $H_2O_2$ ambient cures the dielectric material.

17. The method of claim 16, further comprising reducing a pressure of the process chamber to a cure pressure during flowing the $H_2O_2$ species, wherein, before flowing the $H_2O_2$ species, the semiconductor substrate is exposed only to pressures above the cure pressure.

18. The method of claim 14, wherein providing the semiconductor substrate comprises loading the semiconductor substrate into the process chamber, further comprising:
   flowing an oxidizing gas through the process chamber while loading the semiconductor substrates.

19. The method of claim 14, wherein the process chamber is a batch process chamber configured to accommodate 20 or more substrates.

20. The method of claim 14, further comprising subsequently annealing the semiconductor substrate.

21. The method of claim 14, wherein annealing the semiconductor substrate is performed in an inert gas ambient.

22. The method of claim 14, wherein flowing $H_2O_2$ species into the process chamber is performed at 300° C. or below, and wherein annealing the semiconductor substrate is performed at 400-800° C.

23. The method of claim 14, further comprising, after annealing the substrate:
   flowing $H_2O_2$ species into the process chamber to expose the semiconductor substrate to an $H_2O_2$ ambient; and
   exhausting gases from the process chamber,
   wherein an average residence time of the $H_2O_2$ species in the process chamber is below about 5 minutes.

24. A method of manufacturing a semiconductor device on a semiconductor substrate, the method comprising:
- depositing a flowable dielectric film on the substrate using a carbon-free silicon source and a remote $NH_3$ plasma, without addition of oxygen;
- loading the substrate with the flowable dielectric film into a process chamber; and
- curing the flowable dielectric film by exposing the substrate to hydrogen peroxide.

25. The method of claim 24, wherein exposing the substrate to hydrogen peroxide is performed within about 25 minutes of completing loading the substrate.

26. The method of claim 24, wherein the carbon-free silicon source is a silyl-amine or amino-silane.

27. The method of claim 24, further comprising flowing oxygen into the process chamber while loading the substrate into the process chamber.

28. The method of claim 24, wherein exposing the substrate to hydrogen peroxide is performed at cure pressure within the process chamber, further comprising evacuating the process chamber after loading the substrate while maintaining a process chamber pressure at or above the cure pressure until exposing the substrate.

29. The method of claim 24, wherein a residence time of hydrogen peroxide species in the process chamber is about 5 minutes or less.

30. The method of claim 24, wherein exposing the substrate to hydrogen peroxide is performed without exposing the substrate to any other cure before exposing the substrate to hydrogen peroxide.

31. The method of claim 24, wherein the flowable dielectric film is a low oxygen content film with an oxygen content of 10% or less.

* * * * *